(12) United States Patent
Kim et al.

(10) Patent No.: US 9,425,036 B2
(45) Date of Patent: Aug. 23, 2016

(54) LIGHT SOURCE DEVICE AND SEMICONDUCTOR MANUFACTURING APPARATUS INCLUDING THE SAME

(71) Applicant: SAMSUNG ELECTRONICS CO., LTD., Gyeonggi-do (KR)

(72) Inventors: Wook-Rae Kim, Gyeonggi-do (KR); Hashimoto Kohei, Gyeonggi-do (KR); Won-Don Joo, Incheon (KR); Kwang-Soo Kim, Gyeonggi-do (KR); Byeong-Hwan Jeon, Gyeonggi-do (KR); Sue-Jin Cho, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 237 days.

(21) Appl. No.: 14/151,166

(22) Filed: Jan. 9, 2014

(65) Prior Publication Data

US 2014/0239795 A1    Aug. 28, 2014

(30) Foreign Application Priority Data

Feb. 26, 2013 (KR) ........................ 10-2013-0020543

(51) Int. Cl.
*H01J 61/02* (2006.01)

(52) U.S. Cl.
CPC .................................... *H01J 61/025* (2013.01)

(58) Field of Classification Search
CPC ...................................................... H01J 61/025
See application file for complete search history.

(56) References Cited

U.S. PATENT DOCUMENTS

| 7,084,982 | B2 | 8/2006 | Yamamoto et al. |
| 7,435,982 | B2 | 10/2008 | Smith |
| 7,786,455 | B2 | 8/2010 | Smith |
| 7,928,417 | B2 | 4/2011 | Ershov et al. |
| 7,989,786 | B2 | 8/2011 | Smith et al. |
| 8,148,900 | B1 | 4/2012 | Kirk et al. |
| 8,198,615 | B2 | 6/2012 | Bykanov et al. |
| 8,212,228 | B2 | 7/2012 | Abe et al. |
| 8,242,695 | B2 | 8/2012 | Sumitomo et al. |
| 2009/0314967 | A1 | 12/2009 | Moriya et al. |
| 2010/0078578 | A1 | 4/2010 | Schuermann et al. |
| 2011/0174996 | A1 | 7/2011 | Someya et al. |
| 2011/0181191 | A1 | 7/2011 | Smith et al. |
| 2011/0204265 | A1 | 8/2011 | Smith et al. |

FOREIGN PATENT DOCUMENTS

JP           2011054402           3/2011

OTHER PUBLICATIONS

Machine Translation of 2011-054402.*
Carlton D. Moody, "Maintenance of a Gas Breakdown in Argon Using 10.6 cw Radiation", Journal of Applied Physics, vol. 46, No. 6, Jun. 1975, pp. 2475-2482.
J.P. Freidberg et al., "Resonant Absorption of Laser Light by Plasma Targets", Physical Review Letters, vol. 28, No. 13, Mar. 27, 1972, pp. 795-799.
Joachim Noack et al., "Laser-Induced Plasma Formation in Water at Nanosecond to Femtosecond Time Scales: Calculation of Thresholds, Absorption Coefficients, and Energy Density", IEEE Journal of Quantum Electronics, vol. 35, No. 8, Aug. 1999, pp. 1156-1167.

* cited by examiner

*Primary Examiner* — Nimeshkumar Patel
*Assistant Examiner* — Jacob R Stern
(74) *Attorney, Agent, or Firm* — F. Chau & Associates, LLC

(57) ABSTRACT

Provided are a light source device and a semiconductor manufacturing apparatus including the same. The light source device includes a light-emitting lamp. The light source device includes a laser generator configured to generate and direct a laser beam to the light-emitting lamp. The light source device includes a recycling optical element configured to redirect the laser beam to the light-emitting lamp. The recycling optical element includes a first recycling optical modulator configured to change the phase of the laser beam.

19 Claims, 10 Drawing Sheets

LIGHT SOURCE DEVICE AND SEMICONDUCTOR MANUFACTURING APPARATUS INCLUDING THE SAME

CROSS-REFERENCE TO RELATED APPLICATIONS

This application claims priority under 35 U.S.C. §119 to Korean Patent Application No. 10-2013-0020543, filed on Feb. 26, 2013, the disclosure of which is incorporated by reference herein in its entirety.

TECHNICAL FIELD

Embodiments of the inventive concept relate to a light source device, and more particularly to a semiconductor manufacturing apparatus including the light source device.

DISCUSSION OF RELATED ART

Semiconductor devices are fabricated using various semiconductor manufacturing processes involving a light source device. The light source device may generate light using a laser beam. Various methods have been utilized in order to concentrate the laser beam to a high density in the light source device.

SUMMARY

Exemplary embodiments of the present inventive concept provide a light source device which concentrates laser beams to a high density in a light-emitting lamp, and a semiconductor manufacturing apparatus including the same.

Exemplary embodiments of the present inventive concept provide a light source device which increases light-intensity of a light-emitting lamp without changing the energy of a laser beam, and a semiconductor manufacturing apparatus including the same.

Exemplary embodiments of the present inventive concept provide a light source device which may increase the symmetry of plasma generated from a light-emitting lamp without the occurrence of an interference pattern in the light-emitting lamp, and a semiconductor manufacturing apparatus including the same.

The exemplary embodiments of the present inventive concept are not limited to the above disclosure; other aspects of the present inventive concept may become apparent to those of ordinary skill in the art based on the following descriptions.

In accordance with at least one exemplary embodiment of the present inventive concept, a light source device includes a light-emitting lamp. The light source device includes a laser generator configured to generate and direct a laser beam to the light-emitting lamp. The light source device also includes a recycling optical element configured to redirect the laser beam passing the light-emitting lamp to the light-emitting lamp. The recycling optical element may include a first recycling optical modulator configured to change the phase of the laser beam.

In exemplary embodiments of the present inventive concept, the recycling optical element may include a first recycling mirror configured to change the path of the laser beam passing the light-emitting lamp. The recycling optical element may include a second recycling mirror configured to reflect the laser beam. The laser beam may be reflected by the first recycling mirror in the direction of the light-emitting lamp. The first recycling optical modulator may change the phase of the laser beam reflected by the second recycling mirror.

In exemplary embodiments of the present inventive concept, the recycling optical element may include a third recycling mirror. The third recycling mirror may be configured to change the path of the laser beam reflected by the second recycling mirror. The laser beam may pass the light-emitting lamp. The recycling optical element may include a fourth recycling mirror configured to reflect the laser beam. The laser beam may be reflected by the third recycling mirror to the light-emitting lamp.

In exemplary embodiments of the present inventive concept, the path of the laser beam reflected by the fourth recycling mirror may pass an intersection of the path of the laser beam directed to the light-emitting lamp by the laser generator. The path of the laser beam may be redirected to the light-emitting lamp by the second recycling mirror.

In exemplary embodiments of the present inventive concept, the recycling optical element may include a second recycling optical modulator configured to change the phase of the laser beam. The laser beam may be reflected by the fourth recycling mirror.

In exemplary embodiments of the present inventive concept, the light source device may include a redirecting mirror configured to reflect the laser beam redirected by the recycling optical element in the direction of the light emitting lamp. The laser beam may pass the light-emitting lamp. The path of the laser beam reflected by the redirecting mirror may be the same as the path of the laser beam redirected by the recycling optical element.

In exemplary embodiments of the present inventive concept, the light source device may include a re-illuminating optical modulator. The re-illuminating optical modulator may be located between the light-emitting lamp and the redirecting mirror.

In exemplary embodiments of the present inventive concept, the light source device may include an optical isolator. The optical isolator may be located between the light-emitting lamp and the laser generator.

In exemplary embodiments of the present inventive concept, the light source device may include a collecting mirror configured to direct light generated by the light-emitting lamp in a direction. The laser generator and the recycling optical element may be located outside the collecting mirror.

In at least one exemplary embodiment of the present inventive concept, the collecting mirror may be a hemispherical shape In at least one exemplary embodiment of the present inventive concept, the collecting mirror may include a body and an inner coating layer located on an inner surface of the body. The inner coating layer may include a UV-reflective material.

In at least one exemplary embodiment of the present inventive concept, the light source device may include a lamp power supply element. The lamp power supply element may be electrically connected to the light-emitting lamp.

In at least one exemplary embodiment of the present inventive concept, the lamp power supply element may include a microwave generator.

In accordance with at least one exemplary embodiment of the present inventive concept, a light source device includes a lamp element. The lamp element includes a light-emitting lamp. The light source device includes a laser generator configured to generate and direct a laser beam to the light-emitting lamp. The light source device includes a recycling optical element configured to redirect the laser beam passing the light-emitting lamp back to the light-emitting lamp. The light source device includes a light-absorbing element configured to absorb the laser beam redirected to the light-emitting lamp by the recycling optical element. The recycling optical element may include a recycling optical modulator configured to change the phase of the laser beam.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1A:
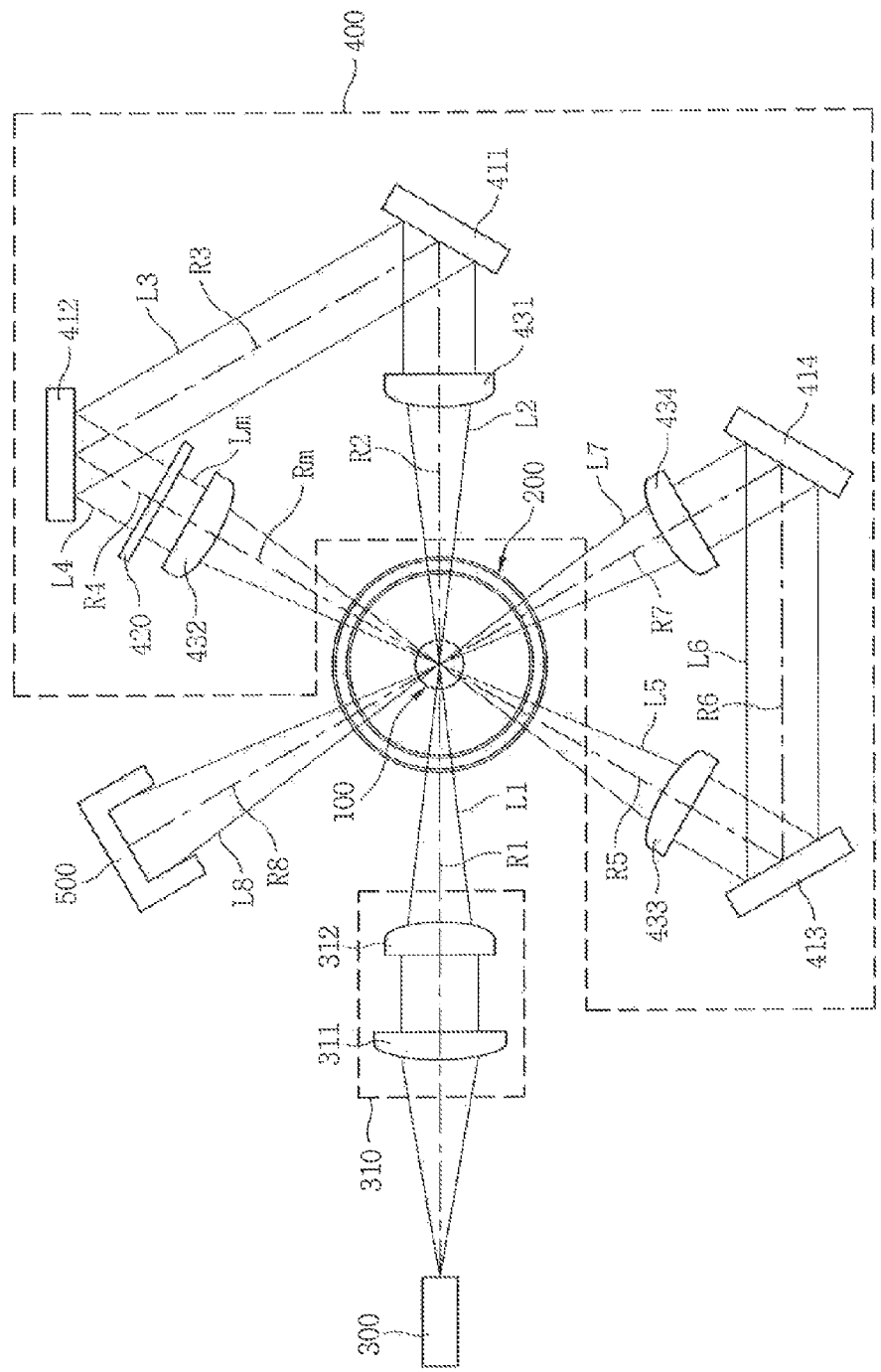
FIG. 1A is a layout showing a light source device in accordance with at least one exemplary embodiments of the present inventive concept.

Exemplary embodiments of the present inventive concept will now be described more fully with reference to the accompanying drawings in which some embodiments are shown. Exemplary embodiments of the present inventive concept may, however, be embodied in different forms and should not be construed as limited to the exemplary embodiments of the present inventive concept set forth herein. Rather, these exemplary embodiments of the present inventive concept are provided so that this disclosure is thorough and complete and fully conveys the present inventive concept to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1B:
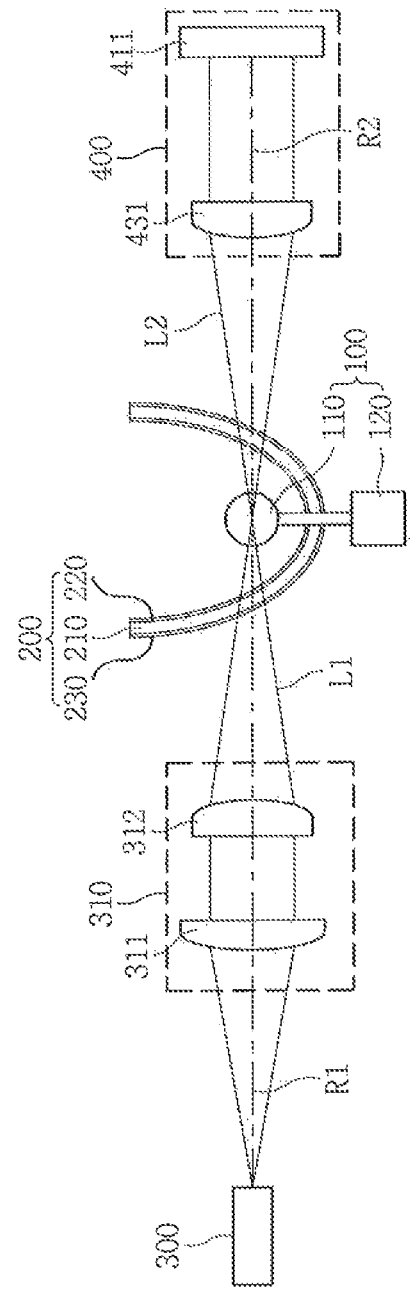
FIG. 1B is a cross-sectional view showing a collecting mirror of a light source device in accordance with at least one exemplary embodiments of the present inventive concept.

FIG. 1A is a layout showing a light source device in accordance with at least one exemplary embodiment of the present inventive concept. FIG. 1B is a cross-sectional view showing a collecting mirror of a light source device in accordance with at least one exemplary embodiment of the present inventive concept.

Referring to FIGS. 1A and 1B, a light source device in accordance with exemplary embodiments of the present inventive concept may include a lamp element 100, a collecting mirror 200, a laser generator 300, a recycling optical element 400, and a light-absorbing element 500.

The lamp element 100 may generate light using a light-emitting material. The light generated from the lamp element 100 may include a variety of wavelengths. For example, the light-emitting material may include mercury or xenon. The lamp element 100 may include a light-emitting lamp 110 and a lamp power supply element 120.

The light-emitting lamp 110 may provide a space in which the light is generated. The light-emitting lamp 110 may provide an enclosed space in which the light-emitting material generates the light. The light may include a variety of wavelengths. The light-emitting material may be accommodated in the light-emitting lamp 110. For example, the light-emitting lamp 110 may include a high-pressure lamp.

The lamp power supply element 120 may supply initial energy to the light-emitting lamp 110. The light-emitting material may generate plasma in the light-emitting lamp 110. The plasma may be generated by the initial energy supplied from the lamp power supply element 120. The light-emitting material may be ionized in the light-emitting lamp 110. The light-emitting material may be ionized by the lamp power supply element 120. For example, the lamp power supply element 120 may include a microwave generator or a pulse-laser generator.

The collecting mirror 200 may determine a path of the light generated by the lamp element 100. The collecting mirror 200 may direct the light generated by the lamp element 100 in a direction. The path of the light directed by the collecting mirror 200 may be perpendicular to paths R1, R5 and R8 of laser beams L1, L5, and L8. Laser beams L1, L5 and L8 may be directed to the light-emitting lamp 110. The path of the light directed by the collecting mirror 200 may be perpendicular to paths R2, R6 and R9 of laser beams L2, L6, and L9. Laser beams L2, L6 and L9 may pass the light-emitting lamp 110. The light generated by the light-emitting material may be directed in a direction by the collecting mirror 200. The collecting mirror 200 may include a body 210, an inner coating layer 220, and an outer coating layer 230.

The body 210 may surround the light-emitting lamp 110. For example, the body 210 may be a hemispherical shape. The light-emitting lamp 110 may be located inside the body 210. The lamp power supply element 120 may be located outside of the body 210. For example, the lamp power supply element 120 may be located under the body 210. The lamp power supply element 120 may pass through the body 210.

The body 210 need not interfere with the progress of the laser beams L1, L5, and L8. The laser beams may be directed to the light-emitting lamp 110. The body 210 need not interfere with the progress of the laser beams L2, L6, and L9. The laser beams L2, L6 and L9 may pass the light-emitting lamp 110. The laser beams L1, L5, and L8 and the laser beams L2, L6, and L9 may pass through the body 210. The body 210 may include a material which transmits the laser beams L1 to L9 at a high transmission rate. The laser beams L1 to L9 may be generated by the laser generator 300.

The inner coating layer 220 may be located on an inner surface of the body 210. The inner coating layer 220 need not interfere with the progress of the laser beams L1, L5, and L8. The laser beams L1, L5 and L8 may be directed to the light-emitting lamp 110. The inner coating layer 220 need not interfere with the progress of the laser beams L2, L6, and L9. The laser beams L2, L6 and L9 may pass through the light-emitting lamp 110. The inner coating layer 220 may include a material which transmits the laser beams L1 to L9 at a high transmission rate. The laser beams L1 to L9 may be generated by the laser generator 300. The inner coating layer 220 may include a material which directs light generated by the light-emitting lamp 110. For example, the inner coating layer 220 may include a UV-reflective material.

The outer coating layer 230 may be located on an outer surface of the body 210. The outer coating layer 230 need not interfere with the progress of the laser beams L1, L5, and L8. The laser beams L1, L5 and L8 may be directed to the light-emitting lamp 110. The outer coating layer 230 need not interfere with the laser beams L2, L6, and L9. The laser beams L2, L6 and L9 may pass through the light-emitting lamp 110. The outer coating layer 230 may include a material which transmits the laser beams L1 to L9 at a high transmission rate. The laser beams L1 to L9 may be generated by the laser generator 300.

The laser generator 300 may be located outside of the collecting mirror 200. The laser generator 300 may generate and direct a laser beam to the light-emitting lamp 110. The plasma generated in the light-emitting lamp 110 by the lamp power supply element 120 may be maintained by the laser beam L1 generated by the laser generator 300. For example, the laser generator 300 may include a fiber laser generator or a continuous wave (CW) laser generator.

The light source device in accordance with the exemplary embodiments of the present inventive concept may include an illuminating optical element 310. The illuminating optical element 310 may concentrate the laser beam L1. The laser beam L1 may be generated by the laser generator 300. The laser beam L1 may be concentrated on an inside of the light-emitting lamp 110. The illuminating optical element 310 may include a first illuminating lens 311 and a second illuminating lens 312.

The first illuminating lens 311 may be located near the laser generator 300. The first illuminating lens 311 may increase the parallelism of the laser beam L1. The laser beam L1 may be generated and directed by the laser generator 300. The laser beam L1 may be directed in parallel by the first illuminating lens 311. For example, the first illuminating lens 311 may be a collimating lens.

The second illuminating lens 312 may be located near the collecting mirror 200. The laser beam L1 may be generated from the laser generator 300. The laser beam L1 may be focused on an inside of the light-emitting lamp 110. The laser beam L1 may be focused by the second illuminating lens 312. For example, the second illuminating lens 312 may be a focusing lens.

The recycling optical element 400 may be located outside of the collecting mirror 200. The recycling optical element 400 may be spaced apart from the laser generator 300. The recycling optical element 400 may direct the laser beam L2 passing through the light-emitting lamp 110. The recycling optical element 400 may redirect the laser beam L2 back to the light-emitting lamp 110. The plasma generated in the light-emitting lamp 110 may be generated by the lamp power supply element 120. The plasma may be maintained by laser beams Lm and L7. The laser beams Lm and L7 may be directed by the recycling optical element 400.

The recycling optical element 400 may include a first recycling mirror 411, a second recycling mirror 412, a third recycling mirror 413, a fourth recycling mirror 414, and a recycling optical modulator 420.

The first recycling mirror 411 may be located on the path R2 of the laser beam L2. The laser beam L2 may pass through the light-emitting lamp 110. The path R2 of the laser beam L2 may match an extension line of the path R1 of the laser beam L1. The laser beam L1 may be generated by the laser generator 300. The first recycling mirror 411 may be located on the extension line of the path R1 of the laser beam L1. The path R2 of the laser beam L2 may be in a same direction as the path R1 of the laser beam L1. The surface of the first recycling mirror 411 need not be perpendicular to the path R2 of the laser beam L2. The laser beam L2 may pass through the light-emitting lamp 110. The first recycling mirror 411 may change the path R2 of the laser beam L2. The laser beam L2 may pass through the light-emitting lamp 110.

The second recycling mirror 412 may be located on a path R3 of the laser beam L3. The laser beam L3 may be reflected by the first recycling mirror 411. The surface of the second recycling mirror 412 need not be perpendicular to the path R3 of the laser beam L3 reflected by the first recycling mirror 411. The second recycling mirror 412 may change the path R3 of the laser beam L3. The laser beam L3 may be reflected by the first recycling mirror 411.

The second recycling mirror 412 may reflect the laser beam L3 in the direction of the light-emitting lamp 110. A path R4 of the laser beam L4 may pass the light-emitting lamp 110. The laser beam L4 may be reflected by the second recycling mirror 412 and pass through the light-emitting lamp 110. The angle between the surface of the second recycling mirror 412 and the path R3 of the laser beam L3 may be the same as the angle between the surface of the first recycling mirror 411 and the path R2 of the laser beam L2.

The path R4 of the laser beam L4 may be different from the path R1 of the laser beam L1. The laser beam L4 may be reflected by the second recycling mirror 412. The laser beam L1 may be generated and directed to the light-emitting lamps 110 by the laser generator 300. The path R4 of the laser beam L4 may intersect the path R1 of the laser beam L1. The path R4 of the laser beam L4 may intersect the path R1 of the laser beam L1 in the light-emitting lamp 110.

The third recycling mirror 413 may be located on a path R5 of the laser beam L5. The laser beam L5 may be reflected by the second recycling mirror 412. The laser beam L5 may pass through the light-emitting lamp 110. The light-emitting lamp 110 may be located between the second recycling mirror 412 and the third recycling mirror 413. The third recycling mirror 413 and the second recycling mirror 412 may be symmetrical with respect to the light-emitting lamp 110. The path R5 of the laser beam L5 may match an extension line of the path R4 of the laser beam L4. The laser beam L5 may be reflected by the second recycling mirror 412. The laser beam L5 may pass through the light-emitting lamp 110. The laser beam L4 may be reflected by the second recycling mirror 412. The third recycling mirror 413 may be located on the extension line of the path R4 of the laser beam L4. The path R5 of the laser beam L5 may be a same direction as the path R4 of the laser beam L4.

The surface of the third recycling mirror 413 need not be perpendicular to a path R6 of the laser beam L6. The laser beam L6 may be reflected by the second recycling mirror 412. The laser beam L6 may pass the light-emitting lamp 110. The third recycling mirror 413 may change the path R6 of the laser beam L6.

The fourth recycling mirror 414 may be located on the path R6 of the laser beam L6. The laser beam L6 may be reflected by the third recycling mirror 413. The surface of the fourth recycling mirror 414 need not be perpendicular to the path R6 of the laser beam L6. The fourth recycling mirror 414 may change the path R6 of the laser beam L6.

The fourth recycling mirror 414 may reflect the laser beam L6. The laser beam L6 may be reflected by the third recycling mirror 413. The laser beam L6 may be reflected in the direction of the light emitting lamp 110. A path R7 of the laser beam L7 may pass the light-emitting lamp 110. The laser beam L7 may be reflected by the fourth recycling mirror 414. The angle between the surface of the fourth recycling mirror 414 and the path R6 of the laser beam L6 may be the same as the angle between the surface of the third recycling mirror 413 and the path R5 of the laser beam L5. The laser beam L5 may be reflected by the second recycling mirror 412. The laser beam L5 may pass the light-emitting lamp 110.

The path R7 of the laser beam L7 may be different from the path R1 of the laser beam L1. The path R7 of the laser beam L7 may intersect the path R1 of the laser beam L1 in the light-emitting lamp 110.

The path R7 of the laser beam L7 may be different from the path R4 of the laser beam L4. The path R7 of the laser beam L7 may intersect the path R4 of the laser beam L4 in the light-emitting lamp 110. The path R7 of the laser beam L7 may pass an intersection of the path R1 of the laser beam L1 and the path R4 of the laser beam L4.

In the light source device in accordance with at least one exemplary embodiments of the present inventive concept, the paths R4 and R7 of the laser beams L4 and L7, respectively, may intersect the path R1 of the laser beam L1 at a point in the light-emitting lamp 110. The laser beams L4 and L7 may be redirected in the direction of the light-emitting lamp 110 by the recycling optical element 400. The laser beam L1 may be generated and directed to the light-emitting lamp 110 from the laser generator 300. In the light source device in accordance with at least one exemplary embodiments of the present inventive concept, the laser beams L1 to L9 may be concentrated to a high density in the light-emitting lamp 110. The laser beams L1 to L9 may be generated by the laser generator 300.

In the light source device in accordance with at least one exemplary embodiments of the present inventive concept, the paths R4 and R7 of the laser beams L4 and L7, respectively, may be different from each other. The laser beams L4 and L7 may be reflected in the direction of the light-emitting lamp 110. In the light source device in accordance with at least one exemplary embodiments of the present inventive concept, the paths R4 and R7 of the laser beams L4 and L7, respectively, may be different from the path R1 of the laser beam L1. In the light source device in accordance with at least one exemplary embodiments of the present inventive concept, laser beams may be directed to the light-emitting lamp 110 in various paths. In the light source device in accordance with exemplary embodiments of the present inventive concept, the symmetry of the plasma generated in the light-emitting lamp 110 may be increased.

The recycling optical modulator 420 may be located on the path R4 of the laser beam L4. The laser beam L4 may be reflected by the second recycling mirror 412. The recycling optical modulator 420 may be located between the light-emitting lamp 110 and the second recycling mirror 412. The recycling optical modulator 420 may be located between the collecting mirror 200 and the second recycling mirror 412.

The recycling optical modulator 420 need not change the path R4 of the laser beam L4. A path Rm of the laser beam Lm may be the same as the path R4 of the laser beam L4. The laser beam L4 may be reflected by the second recycling mirror 412. The laser beam Lm may pass the recycling optical modulator 420.

The recycling optical modulator 420 may change the phase of the laser beam L4. The phase of the laser beam Lm passing the recycling optical modulator 420 may be different from the phase of the laser beam L4 reflected by the second recycling mirror 412. The phase of the laser beam Lm passing the recycling optical modulator 420 may be different from the phase of the laser beam L1 directed to the light-emitting lamp 110. The laser beam Lm may be redirected to the light-emitting lamp 110. The laser beam L1 may be generated and directed to the light-emitting lamp 110 by the laser generator 300.

The recycling optical modulator 420 may change the phase of the laser beam L4 to a random phase. When the laser beam Lm intersects the laser beam L7 in the light-emitting lamp 110, the phase of the laser beam Lm may be different from the phase of the laser beam L7.

In the light source device in accordance with at least one exemplary embodiments of the present inventive concept, the recycling optical element 400 may change the phase of the laser beam L4. The laser beam L4 may be reflected by the second recycling mirror 412. The phase of the laser beam L4 may be changed to a random phase. In the light source device in accordance with at least one exemplary embodiments of the present inventive concept, the phases of laser beams Lm and L7 directed to the light-emitting lamp 110 may be different from each other. When the laser beams L1, Lm, and L7 intersect in the light-emitting lamp 110 in the light source device in accordance with at least one exemplary embodiments of the present inventive concept, the phases of the laser beams L1, Lm, and L7 may be different from each other. In the light source device in accordance with at least one exemplary embodiment of the present inventive concept, an interference pattern due to the phases of the laser beams L1, Lm, and L7 intersecting in the light-emitting lamp 110 need not be generated. Light having high luminance and low intensity-variation may be generated in the light source device in accordance with exemplary embodiments of the present inventive concept.

The recycling optical element 400 of the light source device in accordance with at least one embodiments of the present inventive concept may include a first recycling lens 431, a second recycling lens 432, a third recycling lens 433, and a fourth recycling lens 434.

The first recycling lens 431 may be located between the collecting mirror 200 and the first recycling mirror 411. The first recycling lens 431 may increase the parallelism of the laser beam L2. The laser beam L2 may pass the light-emitting lamp 110. The laser beam L2 may be directed in parallel to the first recycling mirror 411 by the first recycling lens 431. For example, the first recycling lens 431 may be a collimating lens.

The second recycling lens 432 may be located between the collecting mirror 200 and the recycling optical modulator 420. The laser beam Lm may be concentrated in the light-emitting lamp 110 by the second recycling lens 432. For example, the second recycling lens 432 may be a focusing lens. The laser beam Lm may pass the recycling optical modulator 420.

The third recycling lens 433 may be located between the collecting mirror 200 and the third recycling mirror 413. The third recycling lens 433 may increase the parallelism of the laser beam L6. The laser beam L6 may be reflected by the second recycling mirror 412. The laser beam L6 may pass the light-emitting lamp 110. The laser beam L6 may be directed in parallel to the third recycling mirror 413 by the third recycling lens 433. For example, the third recycling lens 433 may be a collimating lens.

The fourth recycling lens 434 may be located between the collecting mirror 200 and the fourth recycling mirror 414. The laser beam L7 may be reflected by the fourth recycling mirror 414. The laser beam L7 may be concentrated in the light-emitting lamp 110 by the fourth recycling lens 434. For example, the fourth recycling lens 434 may be a focusing lens.

The light-absorbing element 500 may be located outside the collecting mirror 200. The light-absorbing element 500 may be located on a path R8 of the laser beam L8. The laser beam L8 may be directed by the recycling optical element 400. The laser beam L8 may pass the light-emitting lamp 110. The path R8 of the laser beam L8 may match an extension line of the path R7 of the laser beam L7. The laser beam L7 may be redirected to the light-emitting lamp 110 by the recycling optical element 400. The path R8 of the laser beam L8 may be in a same direction as the path R7 of the laser beam L7.

The light-absorbing element 500 may absorb the laser beam L8. The laser beam L8 may pass the light-emitting lamp 110. For example, the light-absorbing element 500 may include a beam dump.

Figure 2:
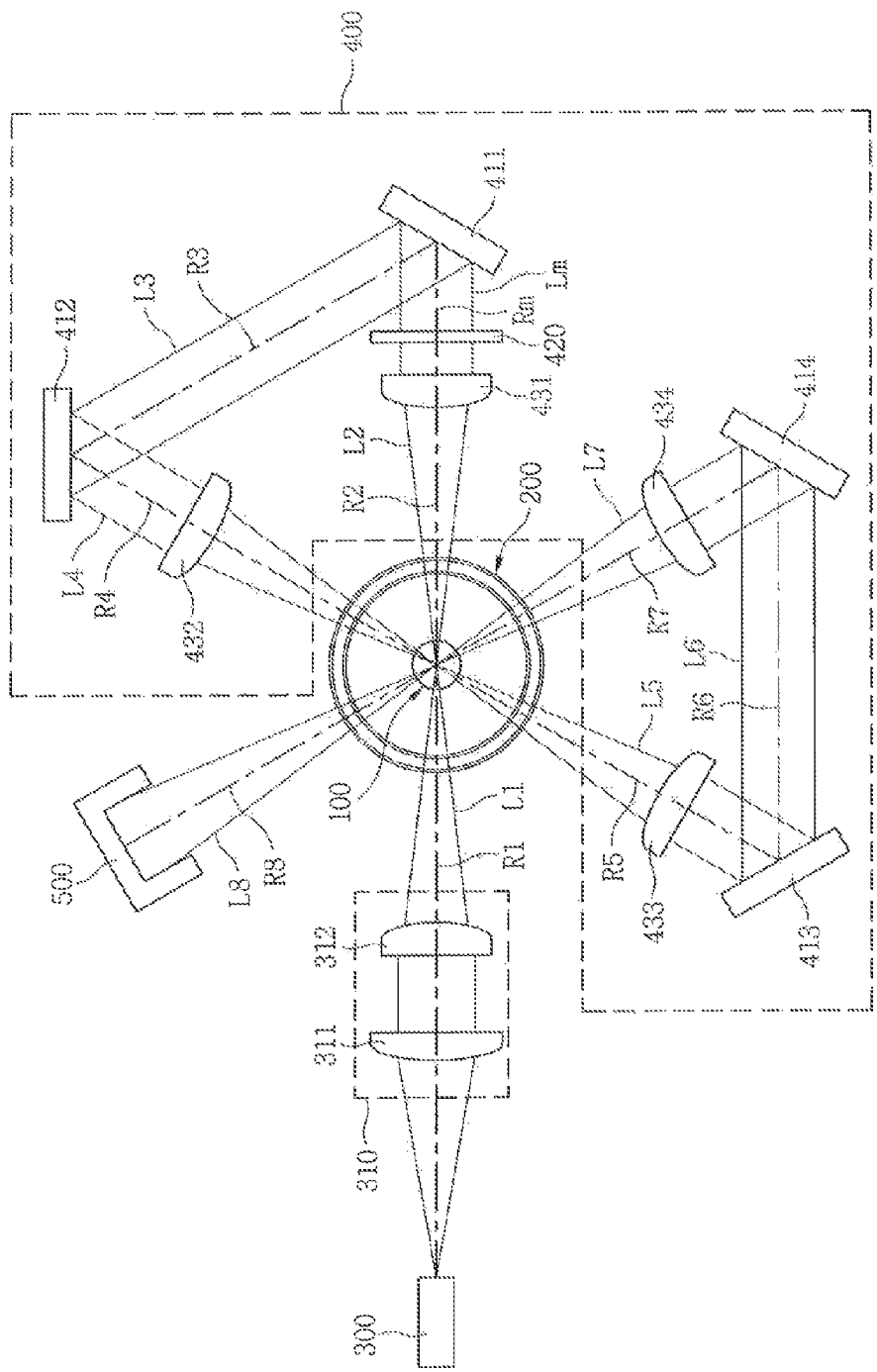
FIG. 2 is a layout showing a light source device in accordance with at least one exemplary embodiments of the present inventive concept.

FIG. 2 is a layout showing a light source device in accordance with at least one embodiments of the present inventive concept.

Referring to FIG. 2, the light source device in accordance with at least one embodiments of the present inventive concept may include a lamp element 100, a collecting mirror 200, a laser generator 300, an illuminating optical element 310, a recycling optical element 400, and a light-absorbing element 500.

The illuminating optical element 310 may include a first illuminating lens 311 and a second illuminating lens 312.

The recycling optical element 400 may include a first recycling mirror 411, a second recycling mirror 412, a third recycling mirror 413, a fourth recycling mirror 414, a recycling optical modulator 420, a first recycling lens 431, a second recycling lens 432, a third recycling lens 433, and a fourth recycling lens 434.

The recycling optical modulator 420 may be located on a path R2 of a laser beam L2. The laser beam L2 may pass the lamp element 100. The recycling optical modulator 420 may be located on a path R1 of a laser beam L1. The laser beam L1 may be generated and directed to the lamp element 100 by the laser generator 300.

The recycling optical modulator 420 may be located between the lamp element 100 and the first recycling mirror 411. The recycling optical modulator 420 may be located between the collecting mirror 200 and the first recycling mirror 411. The recycling optical modulator 420 may be located between the first recycling mirror 411 and the first recycling lens 431.

The recycling optical modulator 420 need not change the path R2 of the laser beam L2. The laser beam L2 may pass the lamp element 100. A path Rm of a laser beam Lm may be the same as the path R2 of the laser beam L2. The laser beam Lm may pass the recycling optical modulator 420.

The recycling optical modulator 420 may change the phase of the laser beam L2. The phase of the laser beam Lm may be different from the phase of the laser beam L2.

Figure 3:
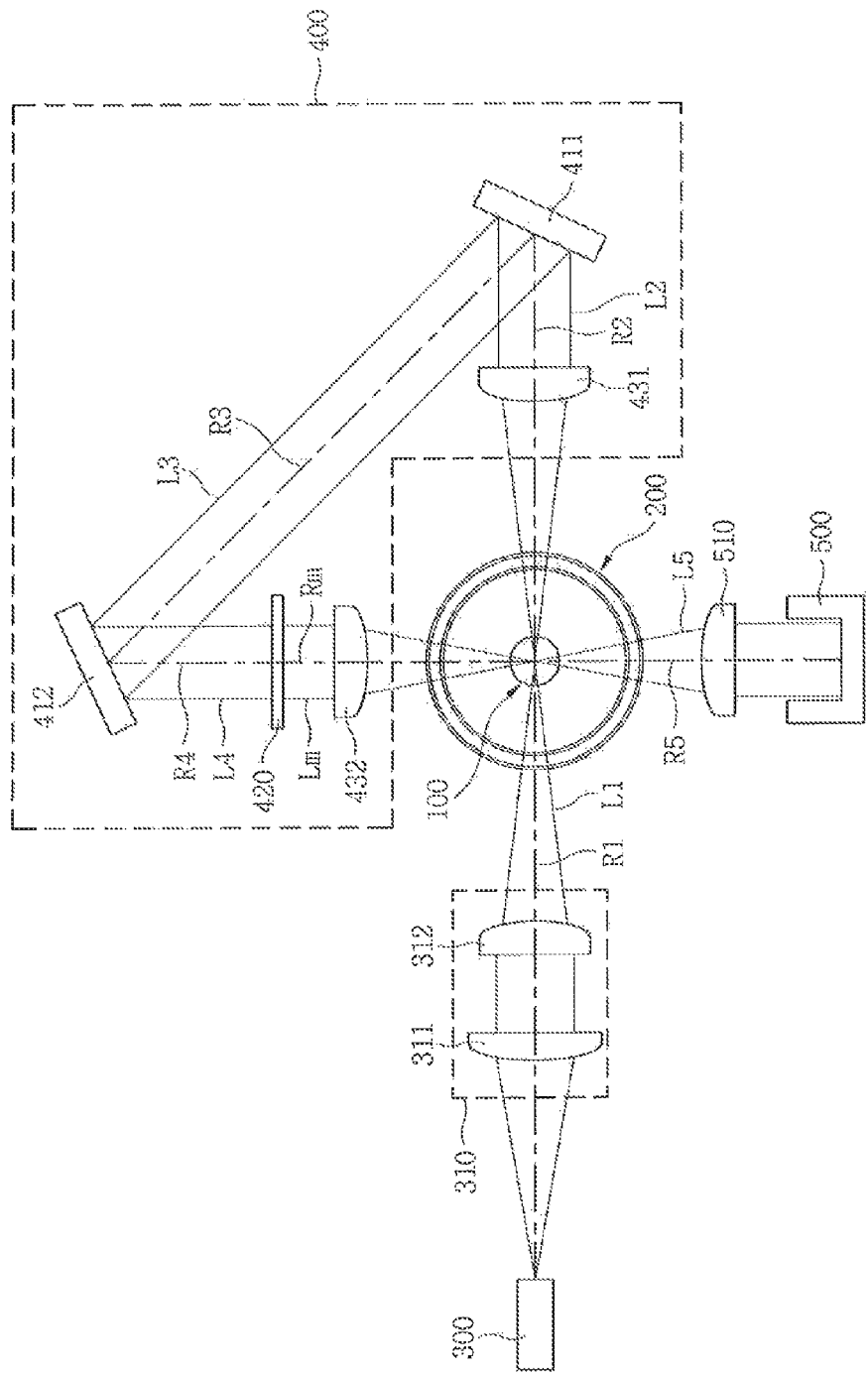
FIG. 3 is a layout showing a light source device in accordance with at least one exemplary embodiments of the present inventive concept.

FIG. 3 is a layout showing a light source device in accordance with at least one exemplary embodiments of the present inventive concept.

Referring to FIG. 3, the light source device in accordance with at least one exemplary embodiment of the present inventive concept may include a lamp element 100, a collecting mirror 200, a laser generator 300, an illuminating optical element 310 having a first illuminating lens 311 and second illuminating lens 312, a recycling optical element 400, a light-absorbing element 500, and a third illuminating lens 510.

The recycling optical element 400 may include a first recycling mirror 411, a second recycling mirror 412, a recycling optical modulator 420, a first recycling lens 431, and a second recycling lens 432.

The third illuminating lens 510 may be located between the collecting mirror 200 and the light-absorbing element 500. The third illuminating lens 510 may be located on a path R5 of a laser beam L5. The laser beam L5 may be directed by the recycling optical element 400. The laser beam L5 may pass the light-emitting lamp 110. The third illuminating lens 510 may increase the parallelism of the laser beam L5. The laser beam L5 may be directed in parallel to the light-absorbing element 500. The laser beam L5 may be directed in parallel to the light-absorbing element 500 by the third illuminating lens 510.

Figure 4A:
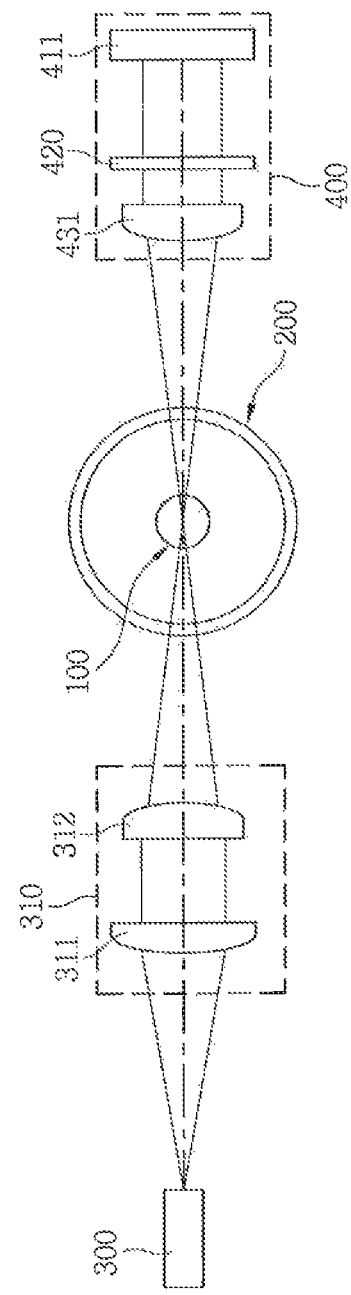
FIGS. 4A and 4B are views showing a light source devices in accordance with exemplary embodiments of the present inventive concept.
Figure 4B:
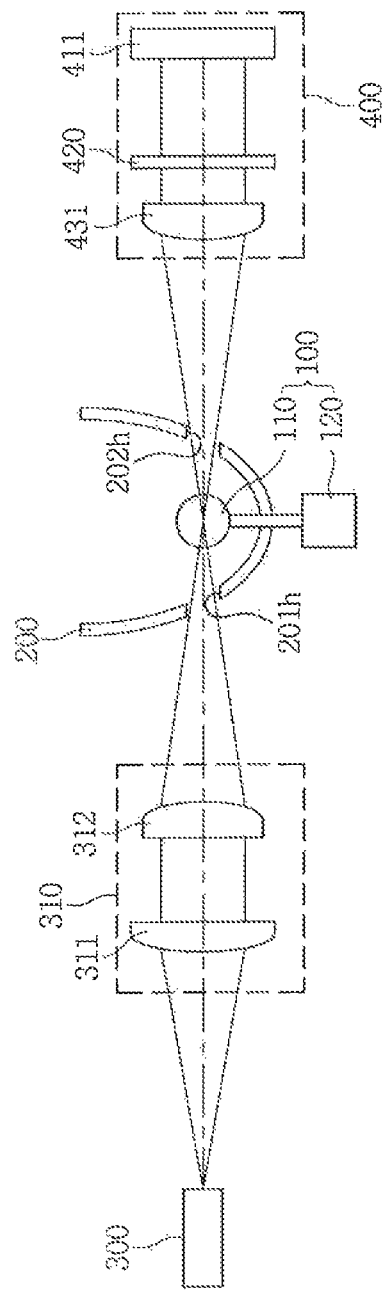

FIG. 4A is a layout showing a light source device in accordance with at least one exemplary embodiments of the present inventive concept, and FIG. 4B is a cross-sectional view showing a light source device in accordance with at least one exemplary embodiments of the present inventive concept.

Referring to FIGS. 4A and 4B, the light source device in accordance with exemplary embodiments of the present inventive concept may include a lamp element 100 having a light-emitting lamp 110 and lamp power supply element 120, a collecting mirror 200, a laser generator 300, an illuminating optical element 310 having a first illuminating lens 311 and second illuminating lens 312, a recycling optical element 400.

The light-emitting lamp 110 may be located between the laser generator 300 and the recycling optical element 400. The laser generator 300, the light-emitting lamp 110, and the recycling optical element 400 may be aligned in a direction.

The collecting mirror 200 may include a first transmitting hole 201h and a second transmitting hole 202h. The first transmitting hole 201h may face the laser generator 300. The second transmitting hole 202h may face the recycling optical element 400. The second transmitting hole 202h and the first transmitting hole 201 may be symmetrical. The first transmitting hole 201h and the second transmitting hole 202h may be aligned in a direction.

A laser beam may be generated by the laser generator 300. The laser beam may be generated and directed to the light-emitting lamp 110 through the first transmitting hole 201h. The laser beam may pass the light-emitting lamp 110. The laser beam may be directed to the recycling optical element 400 through the transmitting hole 202h. The laser beam may be reflected by the recycling optical element 400. The laser beam may be may be directed to the light-emitting lamp 110 through the second transmitting hole 202*h*.

The recycling optical element 400 may include a first recycling mirror 411, a recycling optical modulator 420, and a first recycling lens 431.

The first recycling mirror 411 may be located on a path of a laser beam. The laser beam may pass the light-emitting lamp 110. The surface of the first recycling mirror 411 may be perpendicular to the path of the laser beam. The surface of the first recycling mirror 411 may face the second transmitting hole 202*h*. A path of a laser beam reflected by first recycling mirror 411 may be the same as the path of the laser beam passing the light-emitting lamp 110.

The recycling optical modulator 420 may be located between the collecting mirror 200 and the first recycling mirror 411. The recycling optical modulator 420 may be located on the path of the laser beam passing the light-emitting lamp 110. The recycling optical modulator 420 may be located on the path of the laser beam reflected by first recycling mirror 411.

The first recycling lens 431 may be located between the collecting mirror 200 and the recycling optical modulator 420. The first recycling lens 431 may be located on the path of the laser beam passing the light-emitting lamp 110. The first recycling lens 431 may be located on the path of the laser beam reflected by first recycling mirror 411. The first recycling lens 431 may be a plano-convex lens.

Figure 5:
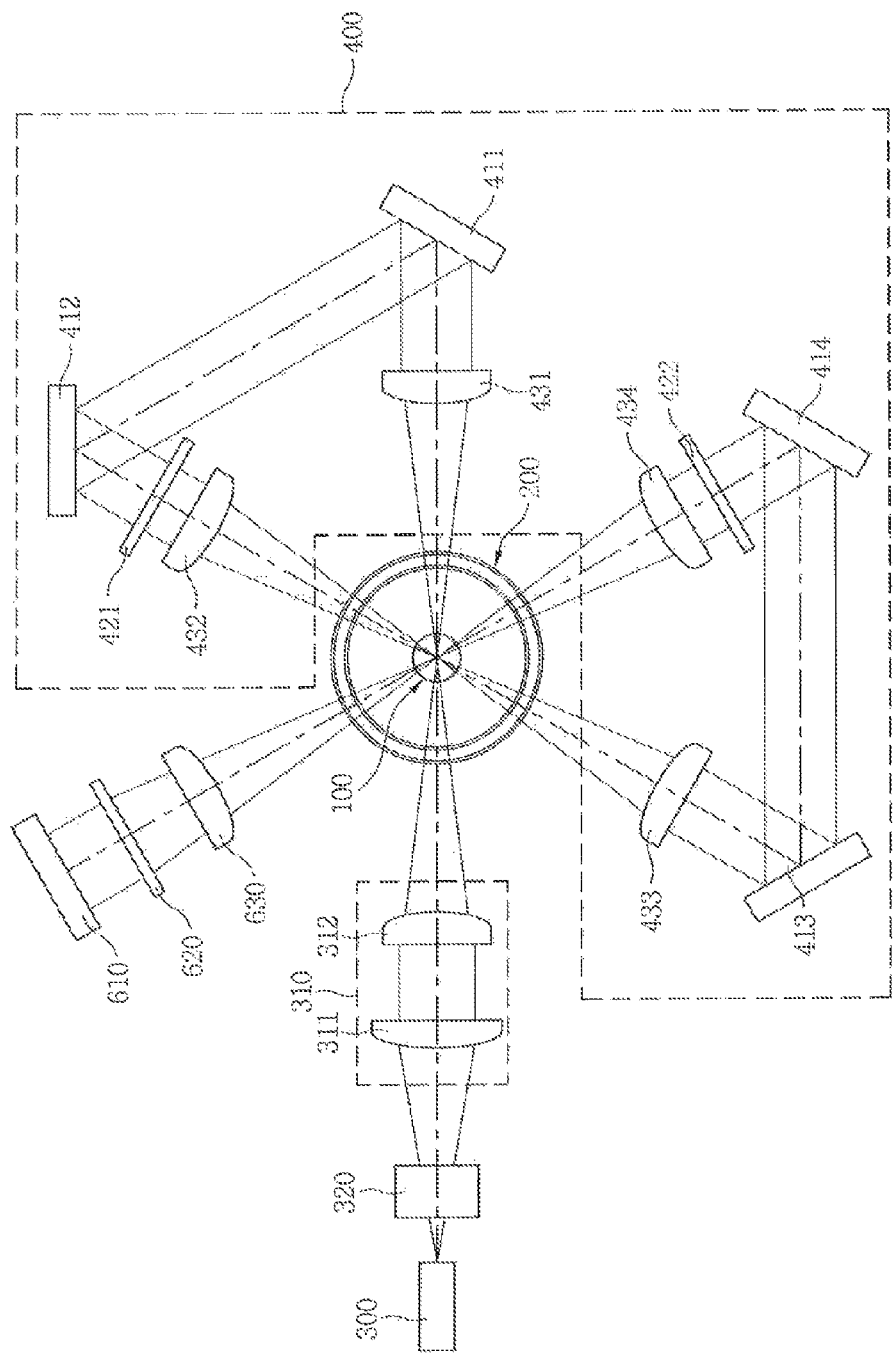
FIG. 5 is a layout showing a light source device in accordance with at least one exemplary embodiments of the present inventive concept.

FIG. 5 is a layout showing a light source device in accordance with at least one exemplary embodiments of the inventive concept.

Referring to FIG. 5, the light source device in accordance with at least one exemplary embodiments of the inventive concept may include a lamp element 100, a collecting mirror 200, a laser generator 300, an illuminating optical element 310 having a first illuminating lens 311 and second illuminating lens 312, a recycling optical element 400, a redirecting mirror 610, a re-illuminating optical modulator 620, and a re-illuminating lens 630.

The recycling optical element 400 may include a first recycling mirror 411, a second recycling mirror 412, a third recycling mirror 413, a fourth recycling mirror 414, a first recycling optical modulator 421, a second recycling optical modulator 422, a first recycling lens 431, a second recycling lens 432, a third recycling lens 433, and a fourth recycling lens 434. The first recycling lens 431, the second recycling lens 432, the third recycling lens 433, and the fourth recycling lens 434 may be a piano-convex lens.

The first recycling optical modulator 421 may be located on a path of the laser beam reflected by the second recycling mirror 412. The first recycling optical modulator 421 may change the phase of the laser beam reflected by the second recycling mirror 412. The first recycling optical modulator 421 may be located between the second recycling mirror 412 and the second recycling lens 432.

The second recycling optical modulator 422 may be located on a path of the laser beam reflected by the fourth recycling mirror 414. The second recycling optical modulator 422 may change the phase of the laser beam reflected by the fourth recycling mirror 414. The second recycling optical modulator 422 may be located between the fourth recycling mirror 414 and the fourth recycling lens 434.

The redirecting mirror 610 may be located outside of the collecting mirror 200. The redirecting mirror 610 may be spaced apart from the laser generator 300. The redirecting mirror 610 may be spaced apart from the recycling optical element 400. A side of the collecting mirror 200 may be surrounded by the laser generator 300, the recycling optical element 400, and the redirecting mirror 610.

The redirecting mirror 610 may be located on a path of a laser beam which passes the lamp element 100 and does not pass the recycling optical element 400. The redirecting mirror 610 may be located on the path of the laser beam which is directed to the lamp element 100 by the recycling optical element 400 and does not pass the recycling optical element 400.

The surface of the redirecting mirror 610 may be perpendicular to a path of a laser beam passing the light-emitting lamp 110. The laser beam may be directed to the redirecting mirror 610. A path of a laser beam reflected by the redirecting mirror 610 may be the same as the path of the laser beam directed to the redirecting mirror 610.

The re-illuminating optical modulator 620 may be located between the collecting mirror 200 and the redirecting mirror 610. The re-illuminating optical modulator 620 may be located on the path of the laser beam directed to the redirecting mirror 610. The re-illuminating optical modulator 620 may be located on the path of the laser beam reflected by the redirecting mirror 610.

The re-illuminating lens 630 may be located between the collecting mirror 200 and the re-illuminating optical modulator 620. The re-illuminating lens 630 may be located on the path of the laser beam directed to the redirecting mirror 610. The re-illuminating lens 630 may be located on the path of the laser beam reflected by the redirecting mirror 610. The re-illuminating lens 630 may be a piano-convex lens.

The light source device in accordance with at least one exemplary embodiments of the present inventive concept may include an optical isolator 320. The optical isolator 320 may be located between the laser generator 300 and the illuminating optical element 310. The optical isolator 320 may be located on the path of the laser beam directed to the lamp element 100. The laser beam may be generated and directed by the laser generator 300.

The optical isolator 320 need not interfere with the progress of the laser beam directed to the lamp element 100. The laser beam may be directed to the lamp element 100 by the laser generator 300. The optical isolator 320 may isolate the laser beam. The laser beam may pass the lamp element 100 and may be directed in the direction of the laser generator 300. For example, the optical isolator 320 may absorb the laser beam. The laser beam directed to the recycling optical element 400 may be redirected by the redirecting mirror 610. The laser beam may be redirected to the lamp element 100 by the recycling optical element 400. The laser beam may be isolated by the optical isolator 320.

Figure 6:
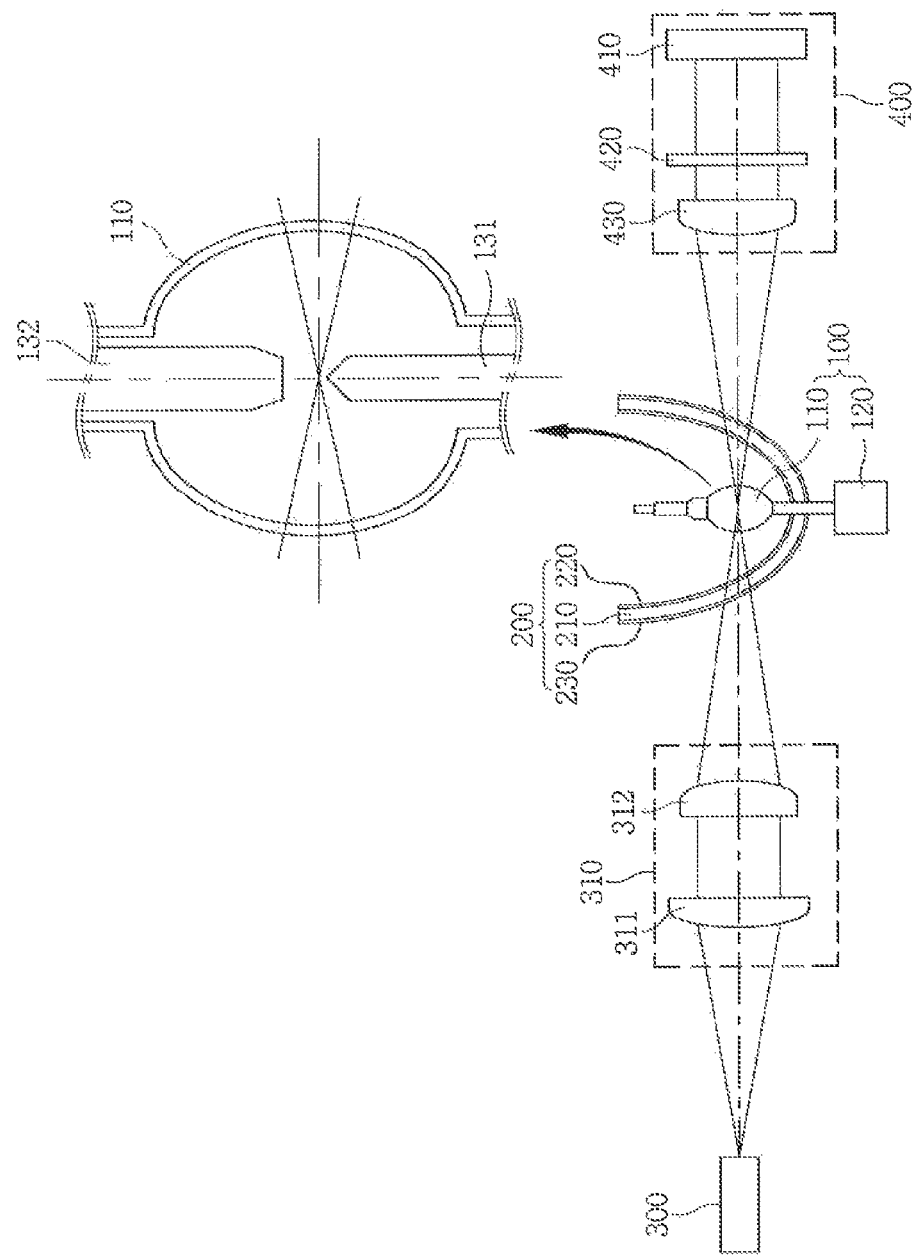
FIG. 6 is a cross-sectional view showing a collecting mirror of a light source device in accordance with at least one exemplary embodiments of the present inventive concept.

FIG. 6 is a cross-sectional view showing a light source device in accordance with at least one exemplary embodiments of the present inventive concept.

Referring to FIG. 6, the light source device in accordance with at least one exemplary embodiments of the present inventive concept may include a lamp element 100 having a light-emitting lamp 110 and lamp power supply element 120, a collecting mirror 200 having a body 210, inner coating layer 220 and outer coating layer 230, a laser generator 300, an illuminating optical element 310 having a first illuminating lens 311 and second illuminating lens 312, and a recycling optical element 400 having a recycling mirror 410, recycling optical modulator 420, and recycling lens 430.

The lamp element 100 may include a first electrode 131 and a second electrode 132. The first electrode 131 may extend into the light-emitting lamp 110. The second electrode 132 may extend into the light-emitting lamp 110. The second electrode 132 may be spaced apart from the first electrode 131. The second electrode 132 may face the first electrode 131. For example, the first electrode 131 may be located below the light-emitting lamp 110. The second electrode 132 may be located above the light-emitting lamp 110. An end of the second electrode 132 may face an end of the first electrode 131.

The first electrode 131 and the second electrode 132 may be electrically connected to the lamp power supply element 120. The polarity of the second electrode 132 may be different from the polarity of the first electrode 131. For example, the first electrode 131 may be a cathode, and the second electrode 132 may be an anode.

The lamp power supply element 120 may apply a high voltage between the first electrode 131 and the second electrode 132. A light-emitting material accommodated in the light-emitting lamp 110 may be ionized by the high voltage applied between the first electrode 131 and the second electrode 132.

Figure 7:
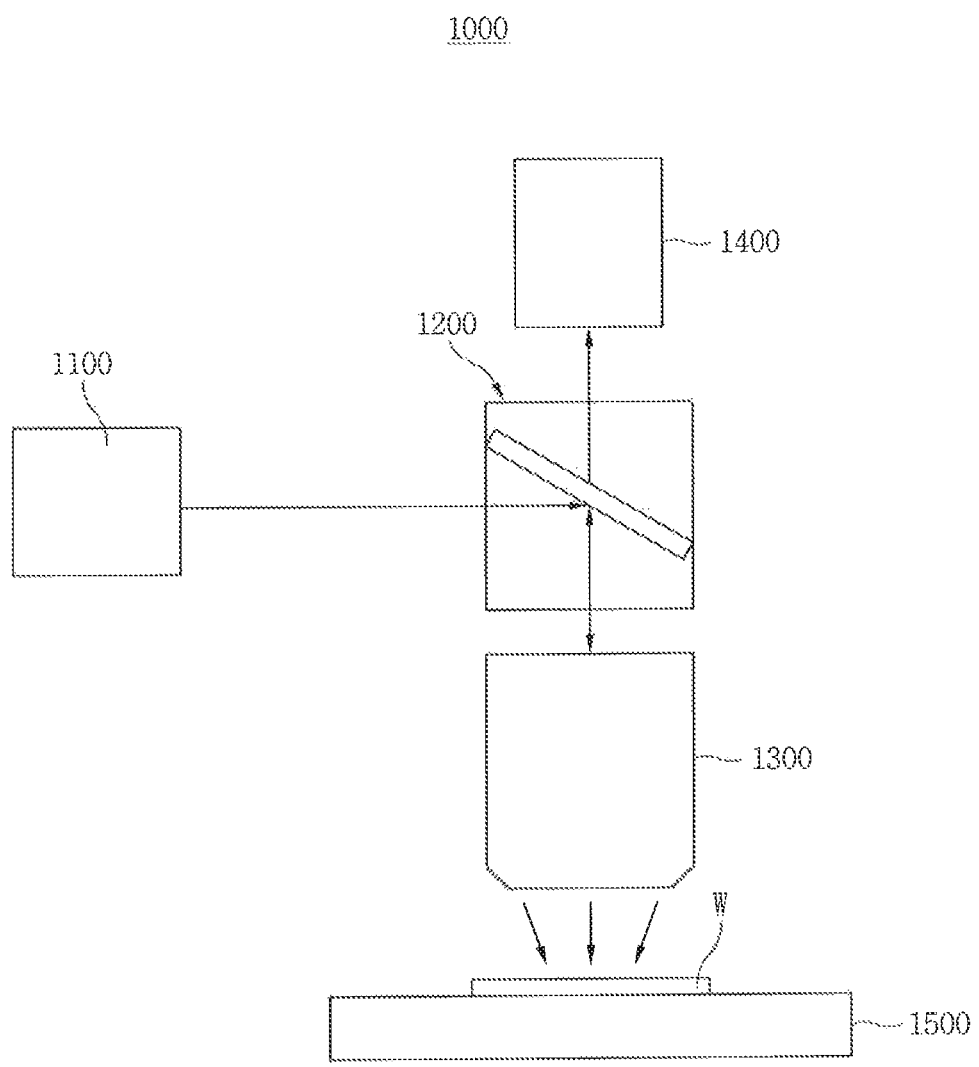
FIGS. 7 and 8 are schematic diagrams showing semiconductor manufacturing apparatuses including light source devices in accordance with exemplary embodiments of the present inventive concept.

FIG. 7 is a schematic diagram showing a semiconductor manufacturing apparatus including a light source device in accordance with exemplary embodiments of the present inventive concept.

Referring to FIG. 7, a semiconductor manufacturing apparatus 1000 including a light source device in accordance with an exemplary embodiment of the present inventive concept may include a light source element 1100, a beam splitter 1200, an optical inspection system 1300, a detector 1400, and a wafer stage 1500. The semiconductor manufacturing apparatus 1000 may be an optical measuring apparatus for measuring a surface of a wafer. The semiconductor manufacturing apparatus 1000 may be an optical inspection apparatus for inspecting a surface defect of a wafer.

The light source element 1100 may radiate light onto a wafer W through the beam splitter 1200 and the optical inspection system 1300. The light source element 1100 may include a light source device in accordance with exemplary embodiments of the present inventive concept. The light source element 1100 may radiate a high-luminance light on the wafer W. The reliability of surface measurement and defect inspection for the wafer W may be increased in the semiconductor manufacturing apparatus 1000 in accordance with exemplary embodiments of the present inventive concept.

The beam splitter 1200 may reflect the light directed from the light source element 1100 in the direction of the wafer W. The beam splitter 1200 may transmit the light reflected by the wafer W. The light reflected by the wafer W may be transmitted to the detector 1400. The optical inspection system 1300 may collect the light reflected by the beam splitter 1200 onto the wafer W. The light reflected by the wafer W may pass through the optical inspection system 1300 and to the beam splitter 1200. The detector 1400 may measure surface morphology of the wafer W using the light reflected by the wafer W. The detector 1400 may identify a defect of a pattern formed on the wafer W using the light reflected by the wafer W. The wafer stage 1500 may support the wafer W. The wafer W may be fixed to the wafer stage 1500.

Figure 8:
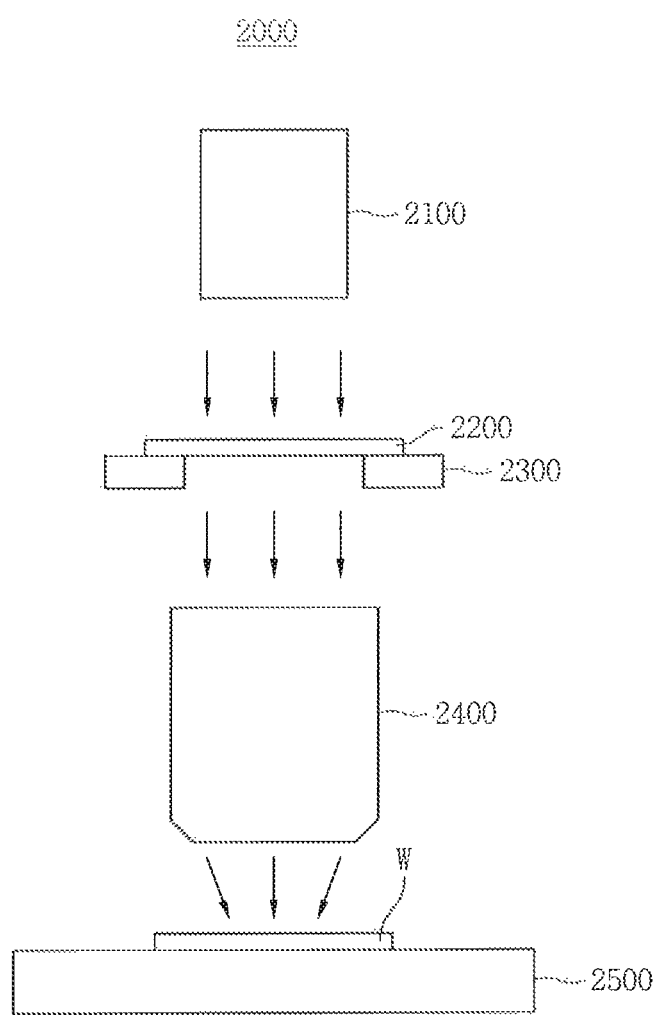

FIG. 8 is a schematic diagram showing a semiconductor manufacturing apparatus including a light source device in accordance with an exemplary embodiment of the present inventive concept.

Referring to FIG. 8, the semiconductor manufacturing apparatus 2000 may include a light source element 2100, a reticle 2200, a reticle table 2300, an exposure optical system 2400, and a wafer stage 2500. The semiconductor manufacturing apparatus 2000 may be an exposure apparatus.

The light source element 2100 may radiate light onto a wafer W. The light may be radiated onto the wafer through the reticle 2200 and the exposure optical system 2400. The light source element 2100 may include a light source device in accordance with exemplary embodiments of the present inventive concept. Light having high luminance and low intensity variation may be generated in the light source element 2100. The reliability of exposure may be increased in the semiconductor manufacturing apparatus 2000 in accordance with exemplary embodiments of the present inventive concept.

The reticle 2200 may be located between the light source element 2100 and the wafer stage 2500. The reticle 2200 may include a predetermined pattern. The light directed by the light source element 2100 may be patterned by the pattern of the reticle 2200. The light source element 2100 may transfer the pattern of the reticle 2200 onto the wafer W. The reticle table 2300 may be located under the reticle 2200. The reticle table 2300 may support the reticle 2200. The reticle table 2300 may be in direct contact with the reticle 2200. The exposure optical system 2400 may concentrate the light onto the wafer W. The light may pass the reticle 2200. The wafer stage 2500 may fix the wafer W. The wafer stage 2500 may be located under the exposure optical system 2400.

The light source device and the semiconductor manufacturing apparatus including the same in accordance with the exemplary embodiments of the present inventive concept may direct a plurality of laser beams to the light-emitting lamp via different paths, without the occurrence of any interference pattern in the light-emitting lamp. The light source device and the semiconductor manufacturing apparatus including the same in accordance with exemplary embodiments of the present inventive concept may concentrate the laser beams to a high density in the light-emitting lamp. The symmetry and intensity of light generated by the light-emitting lamp may be increased in the light source device and the semiconductor manufacturing apparatus including the same in accordance with exemplary embodiments of the present inventive concept.

The foregoing is illustrative of exemplary embodiments of the present inventive concept and is not to be construed as limiting thereof. Although a few embodiments have been described, those skilled in the art will readily appreciate that many modifications are possible without materially departing from the novel teachings of the present inventive concept.

What is claimed is:

1. A light source device, comprising:
   a light-emitting lamp;
   a laser generator configured to generate and direct a laser beam to the light-emitting lamp; and
   a recycling optical element configured to redirect the laser beam to the light-emitting lamp,
   wherein the recycling optical element comprises at least one recycling mirror configured to reflect the laser beam to the light-emitting lamp, and a first recycling optical modulator configured to change the phase of the laser beam redirected to the light-emitting lamp, and
   wherein the laser beam redirected to the light-emitting lamp by the recycling optical element crosses the laser beam directed to the light-emitting lamp by the laser generator in the light-emitting lamp without generating an interference pattern.

2. The light source device of claim 1, wherein the recycling optical element comprises a first recycling mirror configured to reflect the laser beam to a second recycling mirror, and the second recycling mirror configured to redirect the laser beam reflected by the first recycling mirror in the direction of the light-emitting lamp, wherein the first recycling optical modulator is configured to change the phase of the laser beam reflected by the second recycling mirror.

3. The light source device of claim 2, wherein the recycling optical element further comprises a third recycling mirror configured to reflect the laser beam reflected by the second recycling mirror to the light emitting lamp, and a fourth recycling mirror configured to redirect the laser beam reflected by the third recycling mirror to the light-emitting lamp.

4. The light source device of claim 3, wherein the path of the laser beam reflected by the fourth recycling mirror intersects the path of the laser beam generated and directed to the light-emitting lamp by the laser generator and the path of the laser beam redirected to the light-emitting lamp by the second recycling mirror.

5. The light source device of claim 3, wherein the recycling optical element further comprises a second recycling optical modulator configured to change the phase of the laser beam reflected by the fourth recycling mirror.

6. The light source device of claim 1, further comprising:
a redirecting mirror configured to reflect the laser beam redirected by the recycling optical element in the direction of the light-emitting lamp,
wherein the path of the laser beam redirected by the redirecting mirror is the same as the path of the laser beam directed by the recycling optical element.

7. The light source device of claim 6, further comprising:
a re-illuminating optical modulator positioned between the light-emitting lamp and the redirecting mirror.

8. The light source device of claim 6, further comprising:
an optical isolator positioned between the light-emitting lamp and the laser generator.

9. The light source device of claim 1, further comprising:
a collecting mirror configured to direct light generated by the light-emitting lamp in a direction,
wherein the laser generator and the recycling optical element are located outside the collecting mirror.

10. The light source device of claim 9, wherein the collecting mirror is a hemispherical shape.

11. The light source device of claim 9, wherein the collecting mirror comprises a body and an inner coating layer located on an inner surface of the body, wherein the inner coating layer comprises a UV-reflective material.

12. The light source device of claim 1, further comprising:
a lamp power supply element electrically connected to the light-emitting lamp.

13. The light source device of claim 12, wherein the lamp power supply element comprises a microwave generator.

14. A light source device, comprising:
a lamp element comprising a light-emitting lamp;
a hemispherical collecting mirror surrounding the light-emitting lamp;
a laser generator configured to generate and direct a laser beam to the light-emitting lamp, the laser generator positioned outside the collecting mirror, wherein the laser beam directed to the light-emitting lamp has a first phase;
a recycling optical element configured to redirect the laser beam to the light-emitting lamp, the recycling optical element located outside the collecting mirror; and
a light-absorbing element configured to absorb the laser beam redirected to the light-emitting lamp by the recycling optical element,
wherein the recycling optical element includes a recycling mirror configured to reflect the laser beam and a recycling optical modulator configured to change the phase of the laser beam having the first phase to a second phase different than the first phase, wherein the recycling optical modulator is positioned on a path of the laser beam reflected by the recycling mirror, and
wherein the laser beam having the first phase crosses the laser beam having the second phase in the light-emitting lamp without generating an interference pattern due to the first and second phases of the laser beam.

15. The light source device of claim 14, wherein the recycling optical element further comprises a recycling lens configured to increase the parallelism of the laser beam passing the light-emitting lamp.

16. A light source device, comprising:
a light-emitting lamp;
a laser generator configured to generate and direct a laser beam having a first phase to the light-emitting lamp;
a collecting mirror configured to direct light generated by the light-emitting lamp in a plurality of directions; and
a recycling optical element configured to redirect the laser beam to the light-emitting lamp, the recycling optical element including recycling mirrors configured to reflect the laser beam passing through the light-emitting lamp, and a first recycling optical modulator configured to change the phase of the laser beam reflected by the recycling mirrors to a random phase,
wherein the phase of the laser beam redirected to the light-emitting lamp by the recycling optical element differs from the phase of the laser beam directed to the light-emitting lamp by the laser generator.

17. The light source device of claim 16, further comprising a redirecting mirror configured to redirect the laser beam directed by the recycling optical element in the direction of the light-emitting lamp,
wherein the phase of the laser beam redirected to the light-emitting lamp by the redirecting mirror differs from the phase of the laser beam redirected to the light-emitting lamp by the recycling optical element and the phase of the laser beam directed to the light-emitting lamp by the laser generator.

18. The light source device of claim 16, wherein the recycling optical element further includes a a second recycling optical modulator configured to change the phase of the laser beam reflected by the recycling mirrors, wherein the phase of the laser beam changed by the second recycling optical modulator differs from the phase of the laser beam changed by the first recycling optical modulator.

19. The light source device of claim 16, wherein the path of the laser beam redirected to the light-emitting lamp by the recycling optical element intersects the path of the laser beam directed to the light-emitting lamp by the laser generator in the light-emitting lamp.

* * * * *